(12) United States Patent
Yamaguchi et al.

(10) Patent No.: US 9,184,115 B2
(45) Date of Patent: Nov. 10, 2015

(54) SEMICONDUCTOR DEVICE AND METHOD FOR MANUFACTURING SAME

(71) Applicant: Hitachi, Ltd., Chiyoda-ku, Tokyo (JP)

(72) Inventors: Takuto Yamaguchi, Tokyo (JP); Osamu Ikeda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/361,653

(22) PCT Filed: Nov. 7, 2012

(86) PCT No.: PCT/JP2012/078775
§ 371 (c)(1),
(2) Date: May 29, 2014

(87) PCT Pub. No.: WO2013/080759
PCT Pub. Date: Jun. 6, 2013

(65) Prior Publication Data
US 2014/0327121 A1    Nov. 6, 2014

(30) Foreign Application Priority Data

Nov. 30, 2011  (JP) ................ 2011-261185

(51) Int. Cl.
| | |
|---|---|
| *H01L 21/50* | (2006.01) |
| *H01L 21/48* | (2006.01) |
| *H01L 23/495* | (2006.01) |
| *H01L 23/00* | (2006.01) |

(52) U.S. Cl.
CPC ........ *H01L 23/495* (2013.01); *H01L 23/49503* (2013.01); *H01L 23/49513* (2013.01); *H01L 23/49562* (2013.01); *H01L 23/49582* (2013.01); *H01L 24/32* (2013.01); *H01L 2224/32245* (2013.01); *H01L 2224/48091* (2013.01); *H01L 2224/48247* (2013.01); *H01L 2224/73265* (2013.01); *H01L 2924/10253* (2013.01); *H01L 2924/15747* (2013.01); *H01L 2924/15787* (2013.01); *H01L 2924/351* (2013.01)

(58) Field of Classification Search
CPC .................. H01L 23/495; H01L 23/49582
USPC ........................................... 438/123
See application file for complete search history.

(56) References Cited

U.S. PATENT DOCUMENTS

| | | | | |
|---|---|---|---|---|
| 6,518,647 | B1 * | 2/2003 | Tellkamp | 257/646 |
| 6,593,643 | B1 * | 7/2003 | Seki et al. | 257/677 |

(Continued)

FOREIGN PATENT DOCUMENTS

| | | |
|---|---|---|
| JP | 60-218863 A | 11/1985 |
| JP | 2004-273576 A | 9/2004 |
| JP | 2006-35310 A | 2/2006 |

(Continued)

OTHER PUBLICATIONS

Corresponding International Search Report dated Jan. 15, 2013, with English Translation (two (2) pages).

*Primary Examiner* — Luan C Thai
(74) *Attorney, Agent, or Firm* — Crowell & Moring LLP

(57) ABSTRACT

The purpose of the present invention is to increase the reliability of a semiconductor device in which a semiconductor element and a substrate are connected by solder and which is molded by resin.

Solder containing easily volatized metals (Zn, Mg, Sb) is used for a solder material 106, and after a semiconductor element 104 is connected to a lead frame 102 and wire bonding is carried out, vacuum heat treatment is applied, the easily volatized metals in the solder are volatized to adhere to a substrate surface, and an alloy 103 with the lead frame is formed, thereby roughening the substrate surface and improving the adhesive strength of a sealing resin 101 and the substrate.

16 Claims, 4 Drawing Sheets

(56) References Cited

U.S. PATENT DOCUMENTS

| | | | |
|---|---|---|---|
| 7,528,489 B2* | 5/2009 | Kajiwara et al. | 257/772 |
| 2007/0212478 A1 | 9/2007 | Fukunaga et al. | |
| 2008/0206590 A1* | 8/2008 | Ikeda et al. | 428/650 |

FOREIGN PATENT DOCUMENTS

| | | |
|---|---|---|
| JP | 2006-255784 A | 9/2006 |
| JP | 2007-266562 A | 10/2007 |
| JP | 2008-187045 A | 8/2008 |

\* cited by examiner

RESIN
UNEVEN INTERFACE
Zn ALLOY LAYER
SUBSTRATE

1 μm

10a

RESIN
FLAT INTERFACE
SUBSTRATE
1 μm

PRIOR ART

FIG. 5

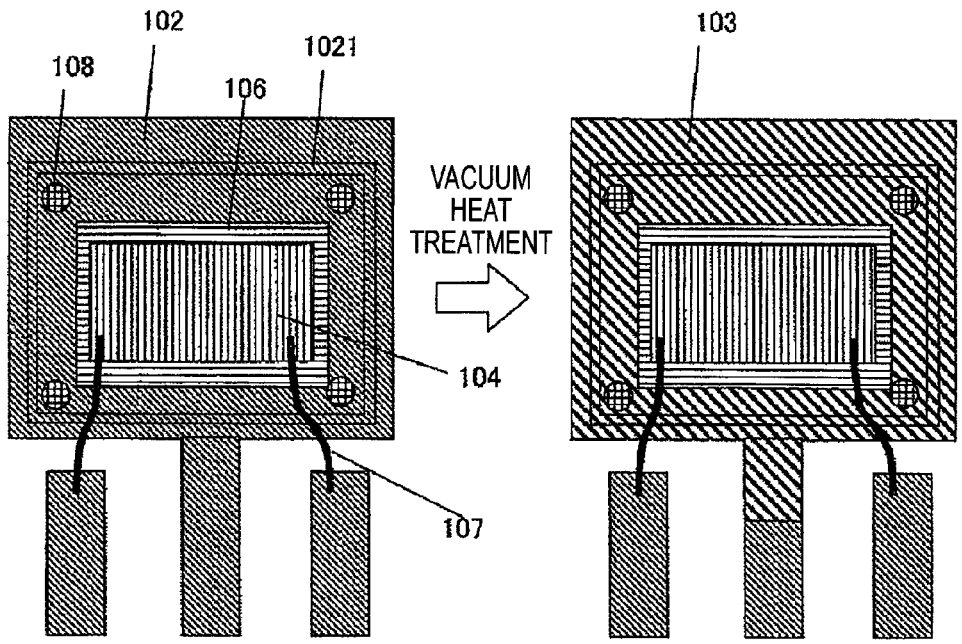

VACUUM HEAT TREATMENT

FIG. 6

|  | SOLDER | VACUUM HEATING | AFTER ASSEMBLY | AFTER PRESSURE COOKER |
|---|---|---|---|---|
| EXAMPLE | Zn-Al | PRESENT | SEPARATION ABSENT | SEPARATION ABSENT |
|  | Zn-Al-Mg | PRESENT | SEPARATION ABSENT | SEPARATION ABSENT |
|  | Sn-Sb | PRESENT | SEPARATION ABSENT | SEPARATION ABSENT |
|  | Zn-Sn | PRESENT | SEPARATION ABSENT | SEPARATION ABSENT |
| COMPARATIVE EXAMPLE | Sn-Ag-Cu | PRESENT | SEPARATION ABSENT | SEPARATION PRESENT |
|  | Zn-Al | ABSENT | SEPARATION ABSENT | SEPARATION PRESENT |

FIG. 7

|  | SOLDER | ADDED SOLDER | AFTER ASSEMBLY | AFTER PRESSURE COOKER |
|---|---|---|---|---|
| EXAMPLE | Sn-Ag-Cu | Zn-Al | SEPARATION ABSENT | SEPARATION ABSENT |
|  | Sn-Ag-Cu | Zn-Al-Mg | SEPARATION ABSENT | SEPARATION ABSENT |
|  | Sn-Ag-Cu | Sn-Sb | SEPARATION ABSENT | SEPARATION ABSENT |
|  | Sn-Ag-Cu | Zn-Sn | SEPARATION ABSENT | SEPARATION ABSENT |

FIG. 8

|  | SOLDER | DUMMY SOLDER | VACUUM HEATING TIME | AFTER ASSEMBLY | AFTER PRESSURE COOKER |
|---|---|---|---|---|---|
| EXAMPLE | Zn-Al | PRESENT | 10min | SEPARATION ABSENT | SEPARATION ABSENT |
|  | Sn-Ag-Cu | PRESENT | 10min | SEPARATION ABSENT | SEPARATION ABSENT |
|  | Bi-Ag | PRESENT | 10min | SEPARATION ABSENT | SEPARATION ABSENT |
|  | Zn-Al | ABSENT | 60min | SEPARATION ABSENT | SEPARATION ABSENT |
| COMPARATIVE EXAMPLE | Sn-Ag-Cu | ABSENT | 60min | SEPARATION ABSENT | SEPARATION PRESENT |

· # SEMICONDUCTOR DEVICE AND METHOD FOR MANUFACTURING SAME

TECHNICAL FIELD

The present invention relates to a semiconductor device and a method for manufacturing the same.

BACKGROUND ART

From household appliances to infrastructure, a power semiconductor has been used for various products at the present time. FIG. 4 illustrates an example of a semiconductor package. A semiconductor package 10b is often manufactured by a process for connecting a semiconductor element 104 and a substrate such as a lead frame 102 by solder 106 containing Pb and Sn, providing a wiring line using a wire 107, and covering an entire portion by a resin 101. Recently, it becomes necessary to use solder not containing Pb from a concern about an environment and the development of the Pb-free solder is promoted. As alternative materials substituting for the Pb solder, Bi, Au, Ag, and Zn solders are considered.

Meanwhile, when the semiconductor package is used for vehicle installation, the semiconductor package is placed in an environment more severe than a conventional vehicle interior, such as an engine room and on-engine. That is, high-reliability products in which performance is maintained for a longer time in a high temperature, high humidity, and high vibration environment are demanded.

The life of various bonding portions is important to the reliability of the semiconductor package, but the reliability of the semiconductor package is often limited by adhesion of the lead frame and the molding resin. For example, in the case in which a semiconductor package having insufficient reliability is used, if the semiconductor package is used during a long period in a high temperature and high humidity environment, the adhesion in a bonded interface of the lead frame and the molding resin is deteriorated and the lead frame and the resin are separated from each other. The separation causes the excessive thermal stress to be generated in a soldered portion of the semiconductor element, so that a crack extension of the solder is accelerated or water permeates into a separation portion to corrode the solder or the element. As a result, the semiconductor package is failed in time shorter than the original life. Therefore, improvement of the adhesion of the lead frame and the resin becomes important to improvement of the life of the product.

CITATION LIST

Patent Literature

PTL 1: JP 2008-187045 A
PTL 2: JP 2007-266562 A

SUMMARY OF INVENTION

Technical Problem

In order to improve adhesion of the resin and a metal, a method of roughening a surface of the metal is used. For example, in PTL 1, a wall surface of a lead frame is roughened to improve the adhesion of the resin and the lead frame. In this method, a top surface of the lead frame cannot be roughened and the adhesive strength of the top surface becomes insufficient. Even if the top surface is roughened, when Ni plating is performed on the top surface thereafter, the top surface may become a flat surface again. In addition, in the case of a method of roughening the surface of the lead frame in a process before soldering, because wettability of the solder is deteriorated, this method is not appropriate.

In addition, in PTL 2, an organic compound is applied to improve the adhesion of the resin and the lead frame. However, in the following process, the organic compound may adhere to a portion in which the compound does not need to adhere, such as a lead tip portion on which plating is performed. Applying the organic compound to only a targeted portion causes a process to become complex, which results in leading to an increase in cost.

An object of the invention is to provide a method of increasing roughness of a surface of a lead frame at a low cost to improve adhesion of the lead frame and a resin and reliability of a semiconductor package.

Solution to Problem

In order to resolve the above-described problems, configurations described in claims are adopted. The present application includes a plurality of solutions to the problems. For example, an alloy of metals contained in a lead and easily volatized metals is formed in a portion of the lead connected to a sealing resin, so that a lead surface is roughened and adhesion with the sealing resin is improved.

Advantageous Effects of Invention

According to the invention, a resin sealing type semiconductor device having a low cost, superior productivity, and high reliability can be provided.

BRIEF DESCRIPTION OF DRAWINGS

FIG. 5 illustrates an example of a top view of the case in which added solder containing easily volatized metals is arranged on the top surface of the lead frame according to the example of the present invention.

FIG. 6 illustrates a reliability evaluation result of a semiconductor package according to the present invention and comparative examples, which are shown in Example 1.

FIG. 7 illustrates a reliability evaluation result of a semiconductor package according to the present invention and comparative examples, which are shown in Example 2.

FIG. 8 illustrates a reliability evaluation result of a semiconductor package according to the present invention and comparative examples, which are shown in Example 3.

DESCRIPTION OF EMBODIMENTS

We have considered a method of improving adhesion of a resin and a lead frame using solder containing easily volatized metals. Among metals applicable as the solder, Zn, Mg, and Sb are metals of which vapor pressures are high. That is, the metals have a characteristic of being easily volatized by heating in a vacuum. We have discovered that, for example solder containing Zn, Mg, and Sb is selected as solder for fixing a semiconductor element to a substrate using the above characteristic, vacuum heat treatment is performed after die bonding and wire bonding are performed, and Zn, Mg, and Sb in the solder can be blown off to the lead frame in the vicinity of a die bonding portion to adhere to the lead frame, thereby roughening the lead frame. After this process is executed, if resin molding is performed, the roughened lead frame and the resin can adhere closely to each other and humidity resistance and bonding reliability can be improved.

Figure 4:
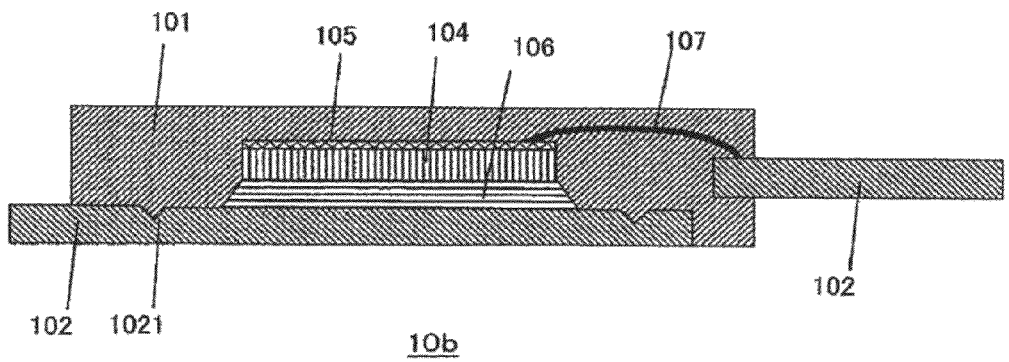
FIG. 4 illustrates an example of a cross-sectional view of a semiconductor package according to the related art.

A general method of manufacturing a semiconductor device will be described using an example illustrated in FIG. 4. First, die bonding by a die bonder is performed, that is, a semiconductor element 104 is mounted on a lead frame 102. In this process, solder processed in a wire, ribbon, or sheet shape or melted solder is supplied to a predetermined place while a lead frame which is made of a metal such as Cu, 42Alloy, and Al and on which Ni or Ni/Ag plating is performed or a ceramic substrate such as a DBC substrate in which a metal plate such as Cu or Al is stuck on ceramic passes on a heated heat block. The supplied solder is beaten in a process called spanking and spreads over a mounted chip. The semiconductor element 104 is mounted (die-bonded to) on spread solder 106. These processes are often executed in nitrogen gas or hydrogen reduction gas. Then, an electrode 105 of a top surface of the semiconductor element 104 and an external terminal of the lead frame 102 are connected by a wire 107 (it may have a ribbon shape) made of a metal such as Cu and Al in the atmosphere, a resin 101 is poured by a transfer molding method and is then cured, and a semiconductor package 10b is manufactured. In this manufacturing method, a time for which the solder on the lead frame is heated is about five minutes.

Figure 3:
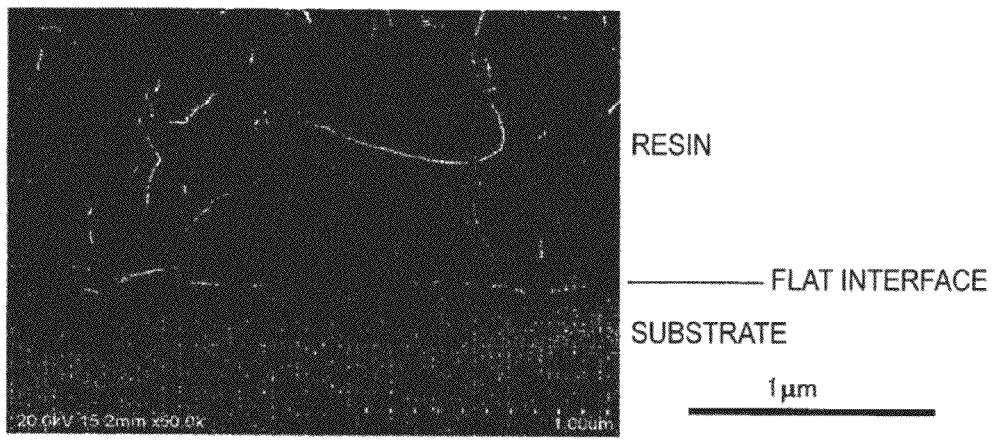
FIG. 3 illustrates an example of a sectional configuration of a semiconductor package according to the related art.

In this process, a top surface of the lead frame 102 is flat as illustrated in FIG. 3 and the bonding force of the resin and the lead frame is not sufficiently strong. Therefore, the resin and the lead frame may be separated by a reliability test to impose conditions more severe than normal use conditions.

In the method of manufacturing the semiconductor device, we have used the solder containing the easily volatized metals (Zn, Mg, and Sb). If the semiconductor device is manufactured by the method according to the related art even though the solder containing the easily volatized metals is used, the solder protrudes to a peripheral portion of the chip. However, the solder does not cover the entire surface of the top surface of the lead frame. This is because an environment is in an atmospheric environment and a heating time is short. In addition, a groove 1021 is often formed not to protrude the solder to the outside and to improve mechanical adhesion of the resin, on the top surface of the lead frame 102. Therefore, a metal member is exposed in a peripheral portion of the top surface of the lead frame 102 and a wall surface thereof. In addition, a surface of the solder protruded from the chip is also in a gentle state. In this state, even though the resin molding is performed after the die bonding and the wire bonding are performed, the adhesion of the lead frame and the resin is not improved.

Figure 2:
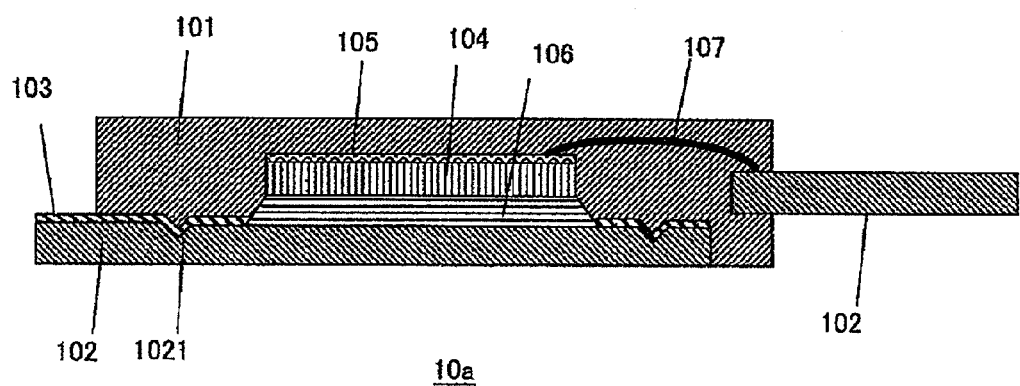
FIG. 2 illustrates an example of a cross-sectional view of a high-reliability semiconductor package in which a roughening alloy layer is formed on a top surface of the lead frame of the semiconductor package according to the example of the present invention.

Therefore, the semiconductor device on which the process for die-bonding the semiconductor element to the substrate by the above method and performing the wire or ribbon bonding has been executed is placed in a vacuum heating furnace and is heated in the atmosphere of 1000 Pa or less and at the temperature of 100° C. or more. FIG. 2 illustrates an example of a semiconductor package according to the present invention. By adding this process, the easily volatized metals are volatized from the solder containing the easily volatized metals and protruding to the chip peripheral portion and the easily volatized metals gradually adhere from surrounding portions to peripheral portions of the solder. The peripheral portions are portions to which the solder does not adhere on the top surface of the lead frame, the wall surface of the lead frame, an inner portion of the groove of the top surface of the lead frame, and a back surface of the lead frame, in the case of the lead frame. The peripheral portions are a surface of a metal wiring line and a wall surface thereof, in the case of a ceramic substrate such as DBC.

When the easily volatized metals adhere to the peripheral portions, the easily volatized metals and the metals of the substrate surface react with each other and are alloyed. For example, when the easily volatized metal is Zn and the metal of the substrate surface is Ni, a Zn—Ni alloy is generated and when the metal of the substrate surface is Cu, a Zn—Cu alloy is generated.

Figure 1:
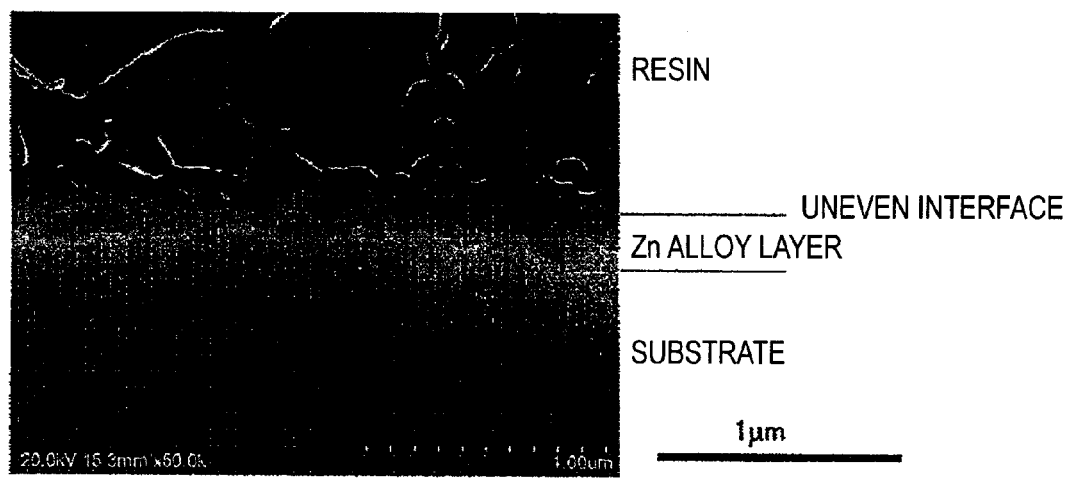
FIG. 1 illustrates an example of a sectional configuration of a high-reliability structure in which an alloy layer of easily volatized metals and a substrate is formed on a surface of a lead frame of a semiconductor package according to an example of the present invention and a resin is cured and connected after the surface is roughened.

When an alloy is formed between the easily volatized metal and the substrate surface, nano-order unevenness is formed on the metal surface and roughness is more than original roughness of the metal surface. As illustrated in FIG. 2, a roughening alloy layer 103 is formed on the top surface of the lead frame 102. The resin is molded by the above process and the adhesive strength of the resin and the substrate is increased by improvement of a mechanical anchor effect and a chemical bonding force by the unevenness. In the example illustrated in FIG. 1, it can be known that a Zn alloy layer having the thickness of about 300 nm from the substrate surface is formed, unevenness of about 100 nm is formed on a surface thereof, and a contact area with the resin increases. In addition, the easily volatized metals are separated from the solder surface of the portion protruded from the chip, so that roughness of the solder surface of the protruded portion also increases and adhesion of the resin and the solder is also improved.

A volatilization phenomenon is caused without depending on the contents of Zn, Mg, and Sb contained in the solder. However, the contents of Zn, Mg, and Sb in the solder are preferably 5 wt. % or more to roughen an entire region of the top surface of the substrate and exhibit an effect of the present invention.

For conditions of the vacuum heat treatment, when a vacuum degree increases and a temperature increases, roughening of a wide range is enabled in short time. The temperature may be increased to a melting point of the solder or more. However, in this case, because a reaction of the melt solder and the lead frame is accelerated and this may affect reliability, attention should be paid.

According to the method according to the present invention, because Zn, Mg, and Sb in the solder used for the die bonding are secondarily used as surface roughening materials to improve the adhesion of the resin and the substrate, it is not necessary to newly introduce different materials. In addition, the vacuum heating process is added, but a large amount of substrates can be processed at a time and an increase in cost can be minimized.

In the method of roughening the substrate before the die bonding, wettability of the solder is deteriorated and a defect may be caused by the die bonding. However, because this method corresponds to a process after the die bonding, it is not necessary to mind the wettability of the solder. In addition, at the same time as the die bonding, that is, in the vacuum, the die bonding may be performed.

The heat treatment process may be executed before the wire bonding process. However, in this case, because the bonding is performed on a place where an electrode film of the top surface of the chip to be wire-bonded and a top surface of a lead are alloyed, according to a treatment temperature/time/vacuum degree, the bonding conditions need to be reexamined.

In the above method, the case in which the materials including the easily volatized metals (Zn, Mg, and Sb) are selected as the materials contained in the solder and the solder used for the die bonding is secondarily used for the surface roughening has been described. Meanwhile, even in the case in which the solder not containing the easily volatized metals is used, the metal surface can be roughened. For example, as illustrated in FIG. 5, after the die bonding is performed using the solder 106 not containing the easily volatized metals, solder 108 containing the easily volatized metals may be supplied to a part of the substrate. For example, a method of preparing a wire containing the easily volatized metals and bonding the wire to the peripheral portion of the top surface of the lead frame, before and after the wire bonding process after the die bonding is completed, is known. In addition, an alloy containing the easily volatized metals melted may be supplied to the peripheral portion of the top surface by a dispenser. As such, even when the solder 106 does not contain the easily volatized metals, the easily volatized metals may be additionally supplied to a peripheral portion thereof. Then, the vacuum heat treatment process is applied to the substrate manufactured as described above, so that the easily volatized metals are volatized to the peripheral portion and the peripheral metal surface can be roughened 103. In the case of this method, because only a small amount of easily volatized metals may be supplied and Zn, Mg, and Sb are cheap metals, a remarkable increase in cost is not caused. The easily volatized metals additionally supplied remain on the inside after the resin molding, but because an amount thereof is small, the reliability is not deteriorated.

The above-described method of additionally supplying the easily volatized metals to the peripheral portion of the substrate is effective for reduction of a process time of the vacuum heat treatment. For example, in the case in which an area of the substrate is significantly larger than an area of the element, even though the easily volatized metals are used in the solder to connect the semiconductor element, heating needs to be performed for a long time to adhere the easily volatized metals to the front surface of the substrate, which may result in leading to the deterioration of productivity and the deterioration of a solder bonding portion. Even in this case, the solder containing the easily volatized metals can be additionally supplied to a portion of the top surface of the substrate in which the semiconductor element is not mounted, at multiple points. By only increasing the supply places of the solder before the semiconductor element is supplied to the substrate, correspondence is enabled with the number of processes rarely increased.

Example 1

In an example described below, a semiconductor device is manufactured and it is checked by a pressure cooker test whether a resin and a substrate are separated from each other, to examine an effect of the present invention.

A Ni-plated Cu lead frame is used in the semiconductor device and Zn—Al solder, Zn—Al—Mg solder, Sn—Sb solder, and Zn—Sn solder are used in solder. A Si chip is connected by each solder in the atmosphere using a die bonder and a wire is connected by a wire bonder. When the wire is connected, the substrate is placed in a high-temperature vacuum furnace and is heated for 30 minutes at the temperature equal to or lower than a melting point of each solder and with a vacuum degree of 1000 Pa or less.

Then, an entire portion is molded by a resin and the semiconductor device is manufactured. As comparative examples, a normal semiconductor device in which vacuum heat treatment is not performed and a semiconductor device in which the vacuum heat treatment is performed, but Sn—Cu solder not containing Zn, Mg, and Sb is used are manufactured.

FIG. 6 illustrates a result obtained by evaluating whether the resin is separated, by a section observation after each sample is provided for the pressure cooker test of 121° C.×100 h. As a result, it is known the separation of the resin and the substrate is not seen by the pressure cooker test and reliability is high, in all the samples in which the solder containing Zn, Mg, and Sb is used and the vacuum heat treatment is performed. Therefore, it is thought that Zn—Ni, Zn—Mg—Ni, and Ni—Sb alloys and surface evenness are formed on an interface of the substrate and the resin and chemical and mechanical adhesive strengths of the resin and the substrate are improved.

Meanwhile, for the samples in which the vacuum heat treatment is not performed and the samples in which the treatment is performed, but the solder not containing Zn, Mg, and Sb is used, the resin and the substrate are separated after the pressure cooker test.

From the above result, it is known that the life of the semiconductor device is improved by using the solder containing Zn, Mg, and Sb and performing the vacuum heat treatment.

Example 2

This example is an example of the case in which Zn, Mg, and Sb are not used in solder, but an alloy or a single body containing Zn, Mg, and Sb is supplied to a surrounding portion of a chip and vacuum heat treatment is performed. A Si chip is connected by a Ni-plated Cu lead frame by Sn—Ag—Cu solder. Next, Zn—Al solder, Zn—Al—Mg solder, Sn—Sb solder, an Zn—Sn solder are supplied to four corners of the chip by a die bonder and wire bonding is then performed. In addition, the vacuum heat treatment is performed, resin molding is performed, and a semiconductor device is manufactured. Because an amount of supplied solder containing Zn, Mg, and Sb is large sufficiently for a volatized amount, the supplied solder remains at the four corners of the chip as it is.

A result that is obtained by performing a pressure cooker test (121° C.×100 h) with respect to the semiconductor device and performing an evaluation is illustrated in FIG. 7. Separation of a substrate and a resin is not seen.

From the above result, it is known that, even though the solder not containing Zn, Mg, and Sb is used for connection of the chip, if the alloy or the single body containing Zn, Mg, and Sb is supplied to the surrounding portion of the chip, the adhesion of the resin and the substrate is improved and reliability of the semiconductor device can be improved.

Example 3

This example is an example of the case in which solder containing Zn, Mg, and Sb is used as solder connecting a chip and a dummy solder sheet containing Zn, Mg, and Sb is supplied to a surrounding portion of the chip, in a method of manufacturing a semiconductor device of a type to supply solder of a sheet shape to a substrate, mount the chip and a weight, and perform connection in a vacuum heating furnace. A surface can be roughened by only Zn, Mg, and Sb of the solder connecting the chip. However, the dummy solder sheet is used for roughening completion in short time. In addition, because the connection of the chip is performed in a state in which the dummy solder sheet is mounted in advance, the number of processes does not increase.

When die bonding is performed in the vacuum heating furnace, a process for producing a vacuum in a temperature range of a melting point or more may be taken to decrease voids in the solder. However, a time thereof is short and a top surface of a substrate cannot be sufficiently roughened even though solder containing Zn, Mg, and Sb is used. Therefore, the vacuum is produced to decrease the voids and the pressure returns to an atmospheric pressure. Then, the temperature decreases to the temperature of the melting point or less and the atmosphere is set as a vacuum atmosphere. Thereby, Zn, Mg, and Sb are sufficiently volatized, so that the top surface of the substrate can be sufficiently roughened and a diffusion reaction of the solder and the substrate can be minimized. In addition, the vacuum heat treatment can be completed in short time by the dummy solder sheet. Then, wire bonding and resin molding are performed and the semiconductor device is manufactured.

A result that is obtained by performing a pressure cooker test (121° C.×100 h) with respect to the semiconductor device manufactured by the above method is illustrated in FIG. 8. The dummy solder sheet containing the easily volatized metals is provided, regardless of whether the easily volatized metals are contained in the solder connecting the chip, so that a roughening process is enabled in short time and separation of the substrate and the resin is not seen after the pressure cooker test.

From the above result, in the semiconductor device of the type to heat the solder sheet and the chip to be overlapped and connect the chip, the dummy solder sheet is arranged and the vacuum is produced again at the temperature of the melting point or less after the solder bonding, so that the top surface of the substrate is roughened in short time and high reliability can be realized.

The present invention has been specifically described on the basis of the embodiments accomplished by the inventors. However, the present invention is not limited to the embodiments and various changes can be made without departing from the scope thereof.

For example, the case in which the solder containing Zn—Al, Zn—Al—Mg, Sn—Sb, or Zn—Sn is used as the solder containing the easily volatized metals has been described. However, if any other solder containing Zn, Sb, and Mg, such as Zn—Al—Cu, Zn—Al—In, Sn—Mg, Bi—Zn, Bi—Sb, and Bi—Mg, is used, an effect of the present invention is obtained.

REFERENCE SIGNS LIST

10*a* high-reliability semiconductor package
10*b* existing semiconductor package
101 resin
102 lead frame
1021 groove
103 roughening alloy layer
104 semiconductor element
105 electrode
106 solder
107 wire
108 added solder (dummy solder)

The invention claimed is:

1. A method of manufacturing a semiconductor device, comprising:
   a connection step of connecting a semiconductor element to a lead using solder;
   an alloy formation step of volatizing easily volatized metals contained in the solder in a decompressed atmosphere and forming an alloy of the easily volatized metals and metals contained in the lead on a surface of the lead; and
   a sealing step of sealing the lead provided with the semiconductor element and the alloy by a resin.

2. The method according to claim 1, wherein the alloy formation step is executed at the same time as the connection step or after the connection step.

3. The method according to claim 2, further comprising:
   a bonding step of bonding a wire or a ribbon to the semiconductor element solder-connected to the lead,
   wherein the alloy formation step is executed after the bonding step.

4. The method according to claim 1, wherein the easily volatized metals contained in the solder connecting the semiconductor element are used as the easily volatized metals to be volatized.

5. The method according to claim 4, wherein the easily volatized metals of 5 wt. % or more are contained in the solder used for the connection.

6. The method according to claim 1, wherein the easily volatized metals are supplied separately from the solder connecting the semiconductor element.

7. The method according to claim 1, wherein the easily volatized metals contain at least one of Zn, Mg, and Sb.

8. The method according to claim 2, wherein the easily volatized metals contained in the solder connecting the semiconductor element are used as the easily volatized metals to be volatized.

9. The method according to claim 3, wherein the easily volatized metals contained in the solder connecting the semiconductor element are used as the easily volatized metals to be volatized.

10. The method according to claim 2, wherein the easily volatized metals are supplied separately from the solder connecting the semiconductor element.

11. The method according to claim 3, wherein the easily volatized metals are supplied separately from the solder connecting the semiconductor element.

12. The method according to claim 2, wherein the easily volatized metals contain at least one of Zn, Mg, and Sb.

13. The method according to claim 3, wherein the easily volatized metals contain at least one of Zn, Mg, and Sb.

14. The method according to claim 4, wherein the easily volatized metals contain at least one of Zn, Mg, and Sb.

15. The method according to claim 5, wherein the easily volatized metals contain at least one of Zn, Mg, and Sb.

16. The method according to claim 6, wherein the easily volatized metals contain at least one of Zn, Mg, and Sb.

* * * * *